United States Patent [19]
Nakai et al.

[11] Patent Number: 5,852,388
[45] Date of Patent: Dec. 22, 1998

[54] VOLTAGE CONTROLLED OSCILLATOR AND SENSITIVITY ADJUSTMENT

[75] Inventors: Shinya Nakai; Masashi Katsumata; Yasuyuki Hattori; Kenta Nagai; Yoshiaki Fukumitsu; Takehiko Ishizuka, all of Chiba, Japan

[73] Assignee: TDK Corporation, Tokyo, Japan

[21] Appl. No.: 901,258

[22] Filed: Jul. 28, 1997

[30] Foreign Application Priority Data

Aug. 5, 1996 [JP] Japan ................................. 8-223053

[51] Int. Cl.$^6$ ....................................................... H03B 5/18
[52] U.S. Cl. .................. 331/177 V; 331/96; 331/117 D; 331/175
[58] Field of Search ................................ 331/96, 107 SL, 331/116 R, 116 FE, 116 M, 117 R, 117 FE, 117 D, 175, 177 R, 177 V, 181

[56] References Cited

U.S. PATENT DOCUMENTS

| | | | |
|---|---|---|---|
| 4,375,621 | 3/1983 | Schneiter et al. | 332/16 T |
| 4,450,416 | 5/1984 | Mears | 331/177 V X |
| 4,990,866 | 2/1991 | Martheli | 331/99 |
| 5,083,098 | 1/1992 | Alidio et al. | 331/99 |
| 5,532,651 | 7/1996 | Jager et al. | 331/96 |

FOREIGN PATENT DOCUMENTS

7-254819  10/1995  Japan.
2 288 088  10/1995  United Kingdom.

*Primary Examiner*—David Mis
*Attorney, Agent, or Firm*—Oblon, Spivak, McClelland, Maier & Neustadt, P.C.

[57] ABSTRACT

A voltage controlled oscillator including a resonator which generates an oscillation signal, a frequency of which is in response to a control signal, and an amplifier which amplifies the oscillation signal. Also included is a frequency adjusting mechanism, as well as a voltage control sensitivity mechanism. In one example, the resonator includes an input terminal to which the control signal is applied, a variable capacitance diode and a main inductor. The oscillation frequency adjusting mechanism includes a first variable capacitor, arranged in parallel with the main inductor of the resonator. In addition, the voltage control sensitivity adjusting mechanism includes a second variable capacitor arranged between the input terminal and the amplifying mechanism, and also arranged between a hot terminal of the variable capacitance diode and a hot terminal of the main inductor.

13 Claims, 10 Drawing Sheets

VOLTAGE CONTROLLED OSCILLATOR AND SENSITIVITY ADJUSTMENT

BACKGROUND OF THE INVENTION

The present invention relates to a voltage controlled oscillator used for high frequency in which a resonator is formed by a laminated structure and electronic parts are mounted on a substrate composed of the laminated body. Also, the present invention relates to a method of adjusting the voltage controlled oscillator. More particularly, the present invention relates to a voltage controlled oscillator and a method of adjusting it used in the field of wireless communication such as a portable telephone.

Figure 10A:
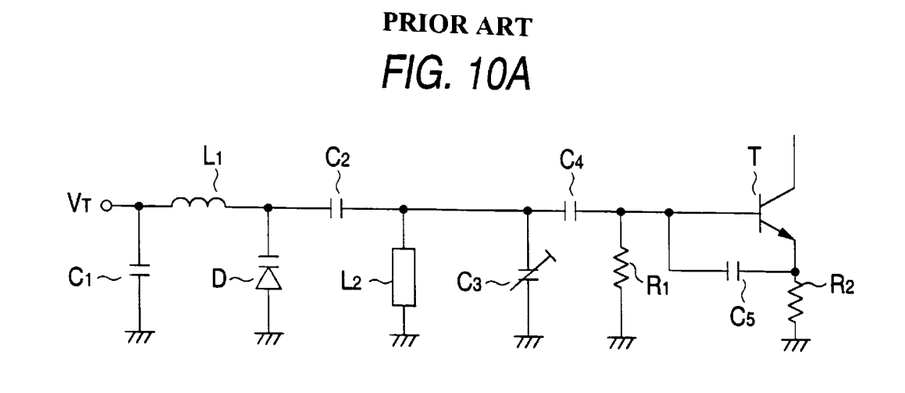
FIG. 10A is a circuit diagram showing a conventional voltage controlled oscillator.

As illustrated in the circuit diagram of FIG. 10A, the conventional voltage controlled oscillator includes: an inductor L1 for choking high frequency components, a capacitor C1 for cutting high frequency components, a capacitor C2 for cutting DC components, a variable capacitance diode D, a resonator L2, a variable capacitor C3 for adjusting an oscillating frequency, a coupling capacitor C4 for coupling, a transistor T for amplifying, and a feedback capacitor C5 and resisters R1 and R2 composing a peripheral circuit of transistor T.

In this voltage controlled oscillator, capacitance $C_v$ of the variable capacitance diode D is varied in accordance with a voltage supplied upon the input terminal 1. Oscillating frequency $f(V_T)$ of this voltage controlled oscillator is expressed by the following equations (1) to (3), wherein the inductance of the resonator L2 is represented by $L_2$, the capacitance of the capacitor C2 is represented by $C_2$, and the capacitance of the capacitor C3 is represented by $C_3$.

$$f(V_T) = 1/[2\pi\{1/(1/C_2) + 1/C_V) + C_3\}L_2]^{1/2} \quad (1)$$

$$C_V = C_0 + aV_T \quad (2)$$

(a<0)

$$df/dV_T = df(V_T, C_2, C_3, C_0, a)/dV_T = -1[1/\{32\pi^4 f(V_T)^3\}]\cdot\{aL_2/(1+C_V/C_2)^2\} \quad (3)$$

Conventionally, capacitor C2 arranged between the input terminal 1 and transistor T is composed of chips mounted on the substrate of the laminated body, or alternatively, capacitor C2 is embedded in the substrate of the laminated body. As described in Japanese Unexamined Patent Publication 4-329705, when a conductor formed on the surface of the laminated body into which resonator L2 is incorporated is trimmed so as to adjust the capacitance of capacitor C3, the oscillating frequency is adjusted in the case where the center frequency $f(V_M)$ shown in FIG. 10B, that is, the center voltage $V_M$ is given from the input terminal.

However, in the voltage controlled oscillator, not only the oscillating frequency $f(V_T)$ but also the voltage control sensitivity $df/dV_T(V_T)$ has an upper and a lower limit to be controlled. That is, as illustrated on the graph of FIG. 10B, it is necessary that the following equations (4) to (6) are realized.

$$f_{L2} > f(V_L) > f_{L1} \quad (4)$$

$$f_{H1} > f(V_H) > f_{H2} \quad (5)$$

$$(f_{H1} - f_{L1})/(V_H - V_L) > df/dV_T(V_T) > (f_{H2} - f_{L2})/(V_H - V_L) \quad (6)$$

where $V_M$ is a center voltage, $V_H$ is an upper limit voltage applied to the input terminal 1, $V_L$ is a lower limit voltage, $f(V_L)$ is an oscillating frequency at the lower limit voltage $V_L$, $f(V_H)$ is an oscillating frequency at the upper limit voltage $V_H$, $f_{L1}$ is an upper limit oscillating frequency at the lower limit voltage $V_L$, $f_{L2}$ is a lower limit oscillating frequency at the lower limit voltage $V_L$, $f_{H1}$ is a lower limit oscillating frequency at the upper limit voltage $V_H$, and $f_{H2}$ is an upper limit oscillating frequency at the upper limit voltage $V_H$.

Figure 10B:
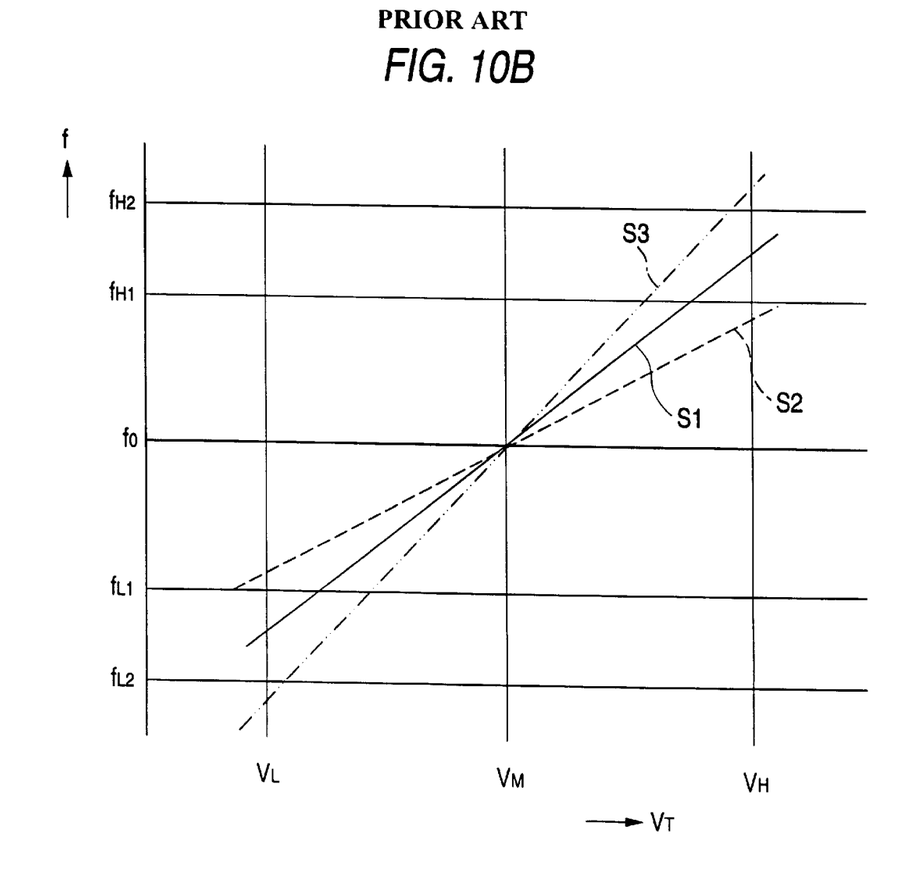
FIG. 10B is a characteristic diagram of frequency and voltage for explaining the problems of the conventional voltage controlled oscillator.

When trimming is conducted only on the center frequency $f(V_M)$ according to the conventional method, the voltage control sensitivity $df/dV_T$ deviates from the inclined line S1, which is a reference line, to the lines S2 and S3 as illustrated on the graph of FIG. 10B. Therefore, the voltage control sensitivity $df/dV_T$ deviates from the upper and the lower limit expressed by the equation (6). The primary reason why the voltage control sensitivity $df/dV_T$ deviates from the upper and the lower limit is described as follows. As can be seen in the above equations (1) to (3), the oscillating frequency $f(V_T)$ depends upon the voltage variable capacitance $C_v$ of the variable capacitance diode D, and this voltage variable capacitance $C_v$ fluctuates greatly, that is, the values of $C_0$ and "a" fluctuate greatly in the equation (2). Due to the foregoing, the yield is deteriorated in the manufacturing process.

SUMMARY OF THE INVENTION

In view of the above problems, it is an object of the present invention to provide a voltage control oscillator which the voltage control sensitivity is controllable. Also, it is an object of the present invention to provide an adjusting method thereof. Due to the foregoing, the yield can be remarkably enhanced in the manufacturing process.

In order to accomplish the above object, the present invention is to provide a voltage controlled oscillator comprising: a capacitor C2 for adjusting a voltage control sensitivity, arranged on a line between an input terminal 1 upon which a control voltage is supplied and an amplifier transistor T, and also arranged between a hot terminal of a variable capacitance diode D and a main inductor L2 for forming a resonator; and a capacitor C3 for adjusting an oscillating frequency, arranged in parallel with the main inductor L2 for forming a resonator.

Also, the present invention is to provide a voltage controlled oscillator comprising: an inductor L3 for adjusting an oscillating frequency, arranged between a line 2 connecting an input terminal 1 upon which a control voltage is supplied, with a transistor T for amplifying, and a main inductor L2 for forming a resonator; and an inductor L4 for adjusting a voltage control sensitivity, arranged on the line 2 between a hot terminal of a variable capacitance diode D and a hot terminal of the inductor L3 for adjusting an oscillating frequency.

Also, the present invention is to provide a voltage controlled oscillator comprising: an inductor L3 for adjusting an oscillating frequency, arranged between a line 2 connecting an input terminal 1 upon which a control voltage is supplied, with a transistor T for amplifying, and a main inductor L2 for forming a resonator; and a capacitor C2 for adjusting a voltage control sensitivity, arranged on the line to 2 between a hot terminal of a variable capacitance diode D and a hot terminal of the inductor L3 for adjusting an oscillating frequency.

Also, the present invention is to provide a voltage controlled oscillator comprising: a capacitor C3 for adjusting an oscillating frequency arranged in parallel with a main inductor L2 for forming a resonator; and an inductor L4 for adjusting a voltage control sensitivity, arranged on the line 2 connecting an input terminal 1 upon which a control voltage is supplied, with a transistor T for amplifying, and also arranged between a hot terminal of a variable capacitance diode D and a hot terminal of the main inductor L2 for forming a resonator.

Also, the present invention is to provide a voltage controlled oscillator, wherein a conductor to compose the capacitor C3 and/or the inductor L3 for adjusting an oscillating frequency is formed on a surface of the substrate of the voltage controlled oscillator, and a conductor to compose the capacitor C2 and/or the inductor L4 for adjusting a voltage control sensitivity is formed on a surface of the substrate of the voltage controlled oscillator.

Also, the present invention is to provide a method of adjusting a voltage controlled oscillator to adjust the voltage controlled oscillators, comprising the steps of: adjusting an oscillating frequency roughly by conducting functional trimming on a conductor composing the capacitor C3 and/or the inductor L3 for adjusting an oscillating frequency; adjusting a voltage control sensitivity to be a predetermined value by conducting functional trimming on a conductor composing the capacitor C2 and/or the inductor L4 for adjusting a voltage control sensitivity; and adjusting an oscillating frequency to be a predetermined value by conducting functional trimming again on the conductor composing the capacitor C3 and/or the inductor L3 for adjusting an oscillating frequency. In this case, functional trimming is defined as a trimming conducted while the characteristic of a voltage controlled oscillator is being measured.

According to the present invention, when the inductor connected in series to the resonator, or the capacitor connected in parallel with the resonator is subjected to functional trimming, the oscillating frequency is adjusted. Also, according to the present invention, when the capacitor or the inductor for adjusting a voltage control sensitivity is arranged on the line, it is subjected to functional trimming. Due to the foregoing, the voltage control sensitivity is adjusted. Therefore, according to the present invention, it is possible to adjust not only the oscillating frequency but also the voltage control sensitivity.

DETAILED DESCRIPTION OF THE PREFERRED EMBODIMENT

First Embodiment

Referring to FIGS. 1 to 4, a first embodiment of the voltage controlled oscillator of the present invention will be explained below. FIG. 1A is a view showing an example of the circuit of the voltage controlled oscillator. This circuit is different from the conventional circuit shown in FIG. 10A as follows. Capacitor C2 used for cutting a DC current, which is arranged on the line 2 and between the hot terminal of the variable capacitance diode D and the hot terminal of the resonator L2, is used both for cutting a DC current and adjusting a voltage control sensitivity.

Figure 2:
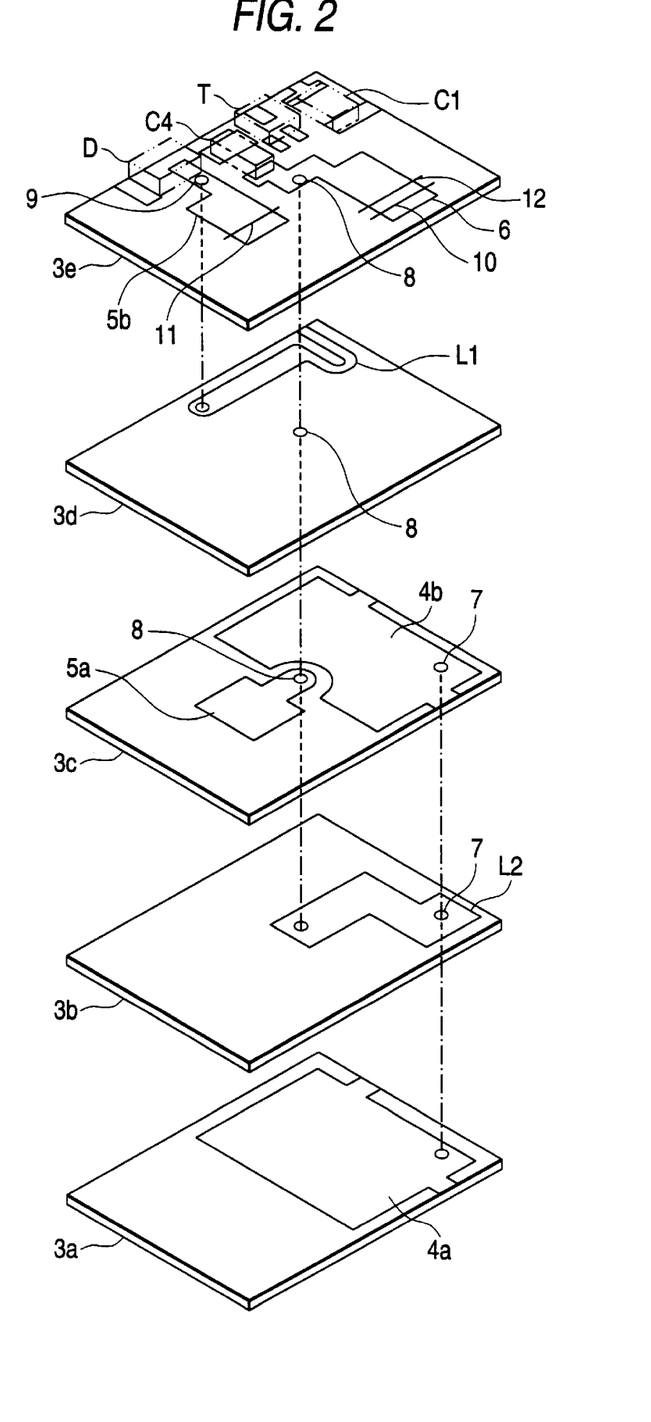
FIG. 2 is an exploded perspective view showing a layer structure of the example illustrated in FIG. 1.

FIG. 2 is a perspective view showing a structure of each layer of the voltage controlled oscillator. FIG. 3 is a view showing a positional relation of the conductor pattern on each layer and also showing a manufacturing process. FIG. 4A is a cross-sectional view showing an adjusting section of this example. In FIGS. 2 and 3, reference numerals 3a to 3e are dielectric layers made of alumina or the like, reference numerals 4a and 4b are earth conductors formed on the dielectric layers 3a, 3c, and L2 is a main inductor composing a strip line resonator in conjunction with these earth conductors 4a, 4b.

L1 is a conductor formed on the above dielectric layer 3d so that it composes an inductor L1 used for choking a current of high frequency. Reference numerals 5a, 5b are conductors composing capacitor C2. Reference numeral 6 is a conductor opposed to the earth conductor 4b, so that the conductor 6 and the earth conductor 4b compose a capacitor C3 for adjusting an oscillating frequency. The above conductors 4a, 4b, 5a, 5b, 6 are made of silver, silver alloy or the like.

Figure 1A:
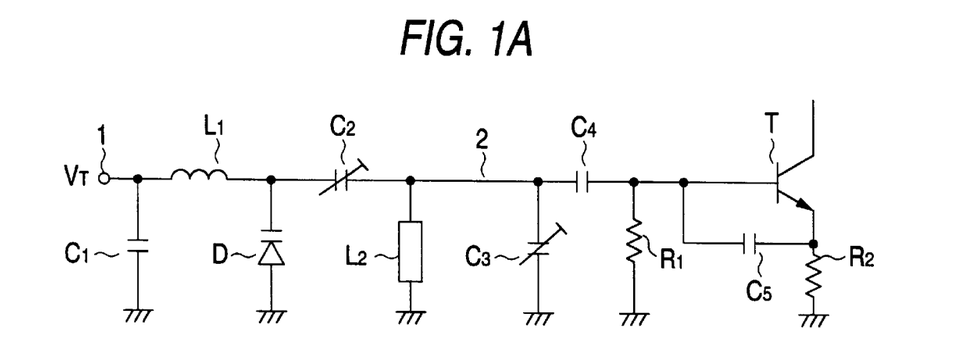
FIG. 1A is a circuit diagram showing an example of the voltage controlled oscillator of the present invention.

On the uppermost dielectric layer 3e, there is provided a transistor T, capacitors C1, C4, and a variable capacitance diode D or the like shown in FIG. 1A.

This voltage controlled oscillator is manufactured as follows. As illustrated in the charts of FIGS. 3A to 3E, conductors are formed on the dielectric layers 3a to 3e made of dielectric sheets; a dielectric sheet is prepared on which the conductor pattern illustrated in FIG. 1A is formed; these dielectric sheets are put on each other and subjected to thermo-compression bonding; the laminated body is cut in accordance with the size of each voltage controlled oscillator; the laminated body is fired; side terminal electrodes (not shown) are formed by means of printing or plating; and capacitors C1, C4, resisters R1, R2, variable capacitance diode D, transistor T and other electronic parts not shown in the drawing are attached onto an upper surface of the laminated body by means of soldering.

When the voltage controlled oscillator is manufactured in the above process, as illustrated in FIGS. 2, 3 and 4A, one end of the main inductor L2 composing the oscillator is connected to the upper and the lower earth conductors 4a, 4b via the through-hole 7, and the other of the main inductor L2 is connected to the conductor 5b for the capacitor mounted on the fifth dielectric layer 3e via the through-hole 8.

Figure 1B:
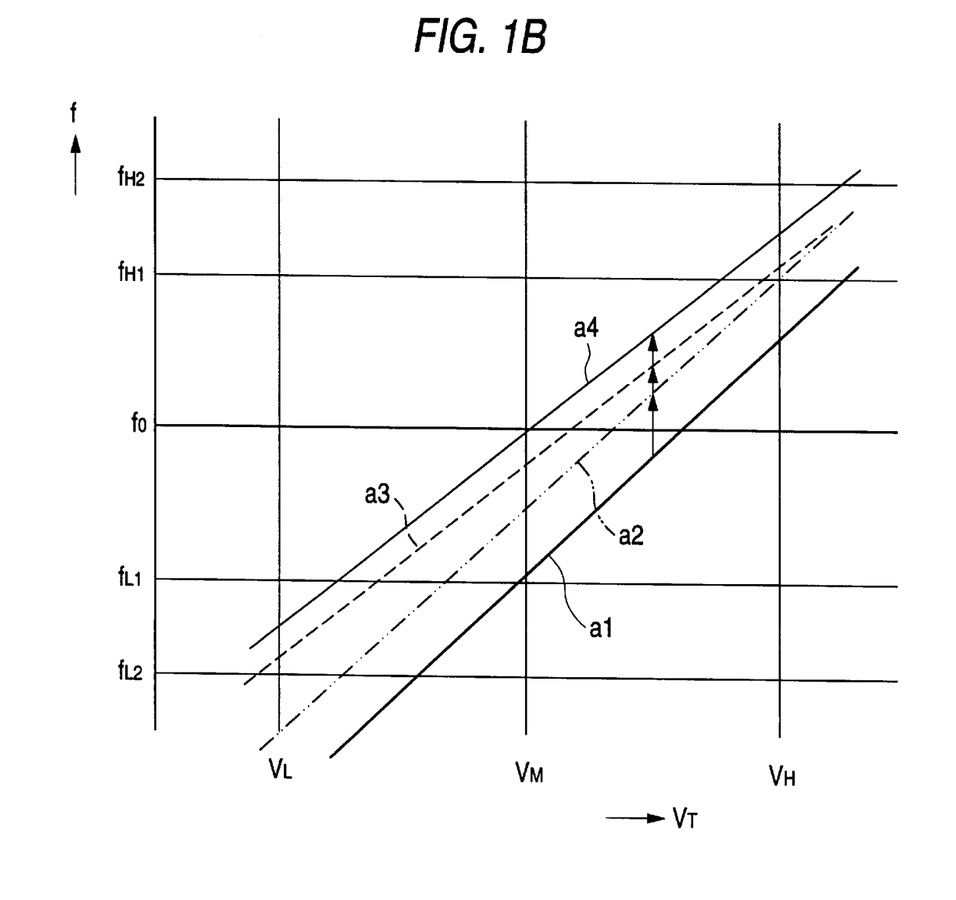
FIG. 1B is a characteristic diagram of frequency and voltage which shows the process of adjustment.

FIG. 1B is a diagram showing a relation between voltage $V_T$ and oscillating frequency f for explaining the method of adjusting the voltage controlled oscillator of the example. Straight lines a1 to a4 in FIG. 1B represent characteristics of (f–V), that is, straight lines a1 to a4 in FIG. 1B represent characteristics of frequency and voltage in each stage of adjustment. As shown by the straight line a1, in the stage before adjustment of the voltage controlled oscillator, frequency $f(V_M)$ at the center voltage $V_M$ is set so that frequency $f(V_M)$ can be lower than the target frequency $f_0$, and an inclination of the characteristic curve of (f–V) is set so that it can be larger than the inclination of the target characteristic curve of (f–V). First, as illustrated in FIG. 3E, by trimming 10 of the conductor 6 of capacitor C3 for adjusting an oscillating frequency, the frequency f ($V_M$) at the center voltage $V_M$ is adjusted so that it can be lower than the target frequency $f_0$ as illustrated by the straight line a2 in FIG. 1B.

Figure 3A:
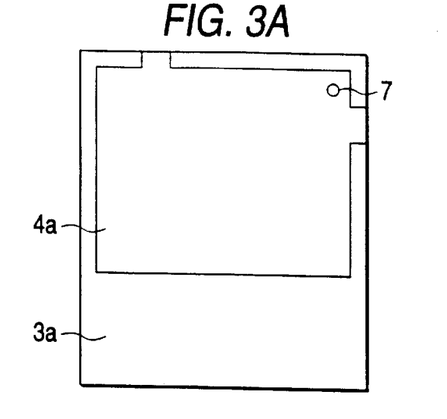
FIGS. 3A to 3E are lamination process drawings of the example shown in FIG. 1.
Figure 3B:
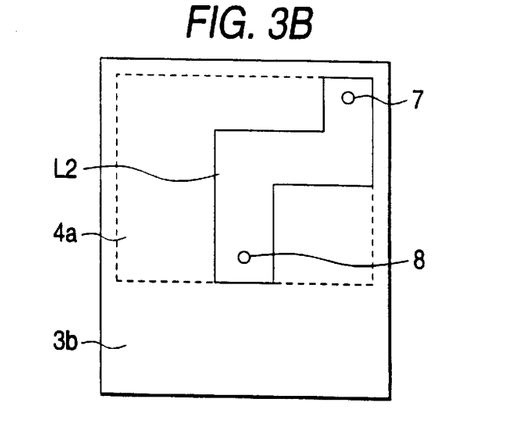
Figure 3C:
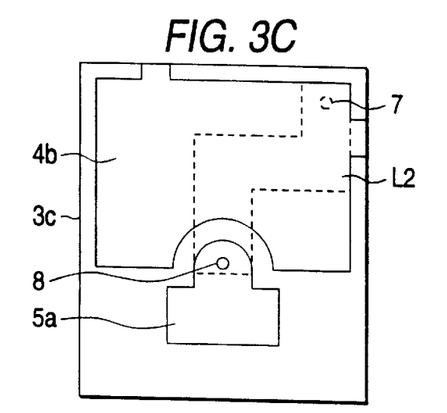
Figure 3D:
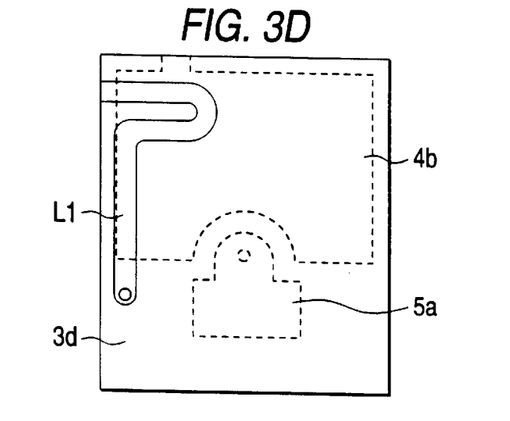
Figure 3E:
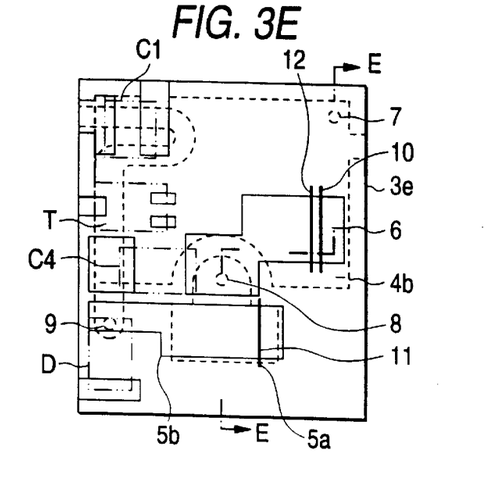
Figure 4A:
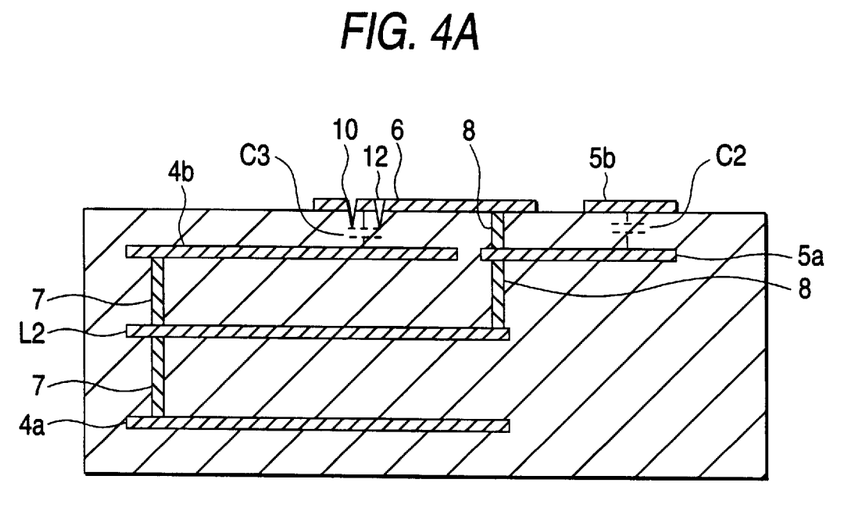
FIG. 4A is a cross-sectional view taken on line E—E in FIG. 3E.

Next, as illustrated in FIG. 3E, by trimming 11 of the capacitor C2 for adjusting voltage control sensitivity, the voltage control sensitivity $df/dV_T$ is adjusted to a target sensitivity as illustrated by the straight line a3 in FIG. 1B.

Next, as illustrated in FIG. 3E, by again trimming 12 of the capacitor C3 for adjusting oscillating frequency, the center frequency f ($V_M$) is adjusted to the target frequency $f_0$ as illustrated by the straight line a4 in FIG. 1B.

As described above, when the voltage control sensitivity is adjusted as well as the oscillating frequency, it is possible to prevent the deterioration of voltage control sensitivity and greatly enhance the yield in the manufacturing process. When trimming is conducted in three steps, it is possible to perform a highly accurate adjustment.

Second Embodiment

FIG. 4B and FIGS. 5 to 7 are views showing a second embodiment of the present invention. As illustrated in FIG. 5A, the inductor L3 for adjusting an oscillating frequency is interposed between the main inductor L2 for forming a resonator and the line 2 which is arranged between the input terminal 1, upon which the control voltage is supplied, and the transistor T for amplifying. On the above line, the inductor L4 for adjusting the voltage control sensitivity is interposed between the hot terminal of the variable capacitance diode D and the hot terminal of the inductor L3 for adjusting an oscillating frequency.

Figure 4B:
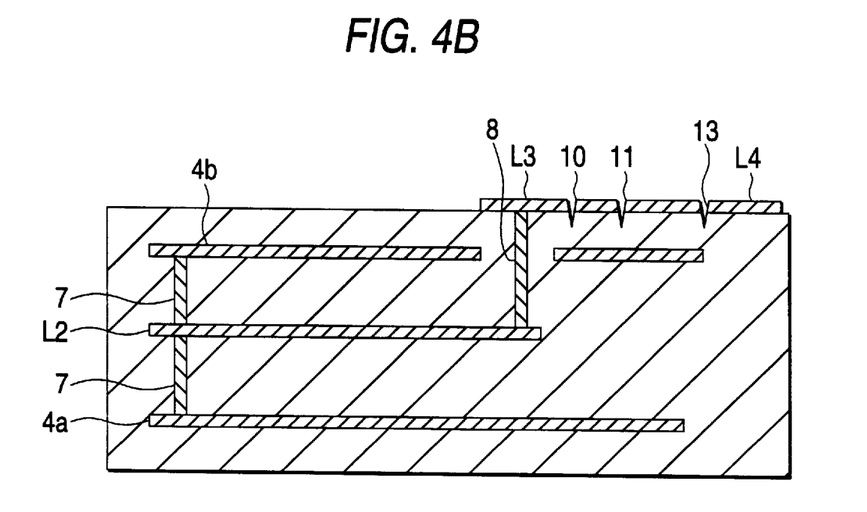
FIG. 4B is a cross-sectional view taken on line F—F in FIG. 7E.
Figure 6:
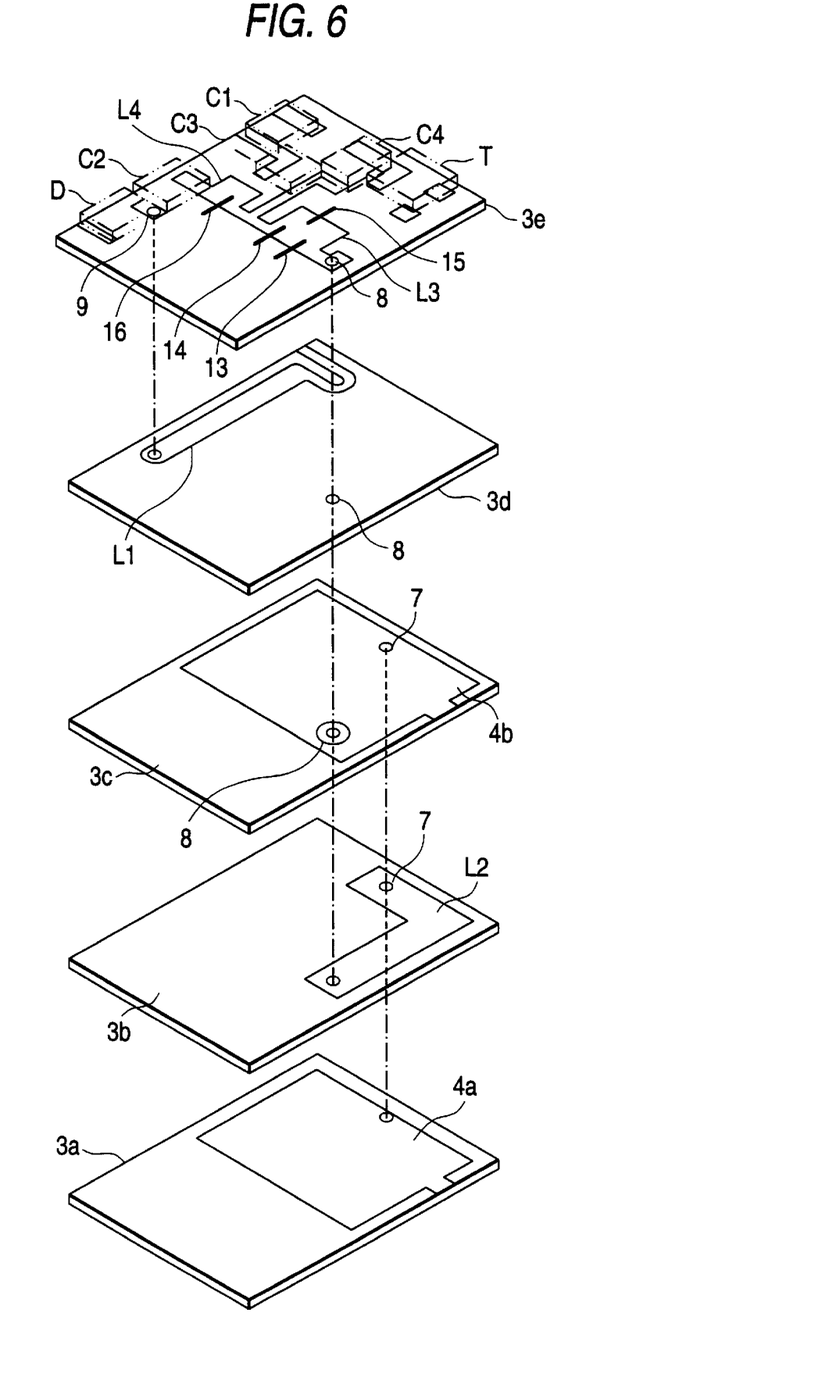
FIG. 6 is an exploded perspective view showing a layer structure of the example illustrated in FIG. 5.

FIG. 6 is a perspective view showing an arrangement of each layer composing this example. FIG. 7 is a view showing a positional relation of the conductor pattern on each layer in the manufacturing process. FIG. 4B is a cross-sectional view showing an adjustment portion of this example. Like reference characters are used to indicate like parts in FIGS. 2, 3, 6 and 7. FIGS. 7A to 7E show the order of laminating processes. In FIGS. 6 and 7, a symbol L3 is a conductor which constitutes the inductor L3 for adjusting an oscillating frequency. When a trimming is conducted as illustrated by the reference numerals 13 to 15, length of the passage in which an electric current flows is extended. Due to the foregoing, inductance is increased, so that the oscillating frequency can be lowered.

In FIGS. 6 and 7, L4 is a conductor composing the inductor L4 for adjusting a voltage control sensitivity. When a trimming is conducted as illustrated by the reference numeral 16, the voltage control sensitivity can be increased.

As shown by the straight line b1 in FIG. 5B, before conducting the adjustment, the voltage controlled oscillator of this example is set as follows. The frequency $f(V_M)$ at the center voltage is set to be higher than the target frequency $f_0$, and the inclination of the characteristic curve of (f–V) of voltage control sensitivity is set to be smaller than the inclination of the target characteristic curve of (f–V). First, by trimming of the inductor L3 connected in series to the inductor L2 composing a resonator, that is, by trimming as shown by the reference numerals 13 to 15 in FIG. 7E, length of the passage in which an electric current flows is increased so that the inductance can be increased. Due to the foregoing, as shown by the straight line b2 in FIG. 5B, the center oscillating frequency $f(V_M)$ is made to come close to the target frequency $f_0$.

Figure 7A:
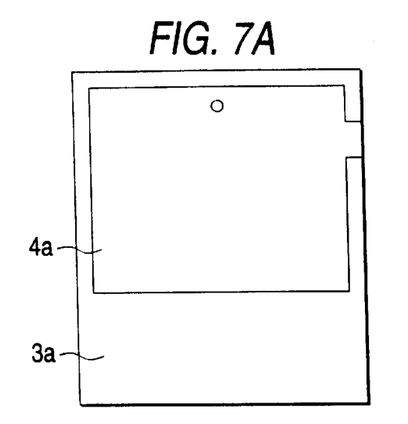
FIGS. 7A to.7E are lamination process drawings of the example shown in FIG. 5.
Figure 7B:
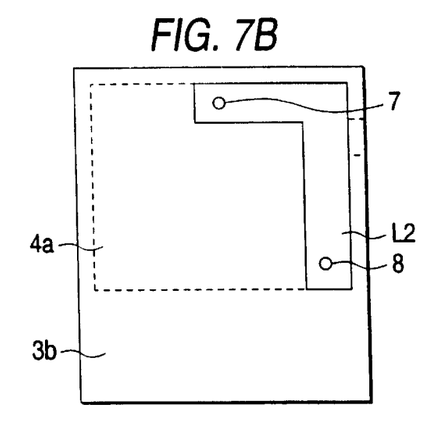
Figure 7C:
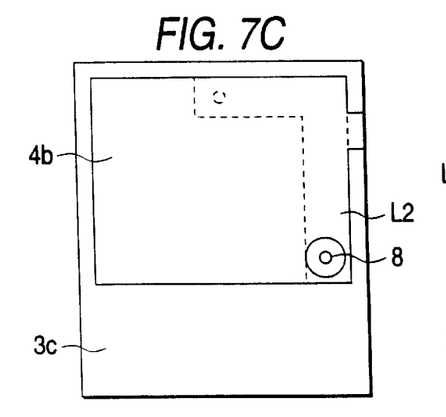
Figure 7D:
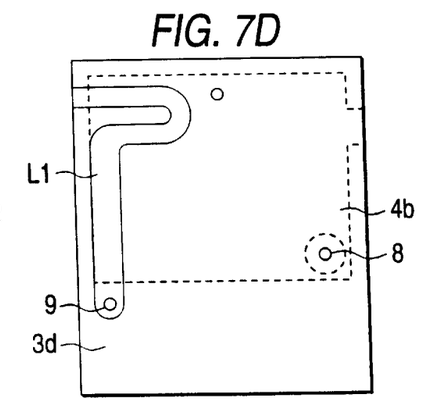
Figure 7E:
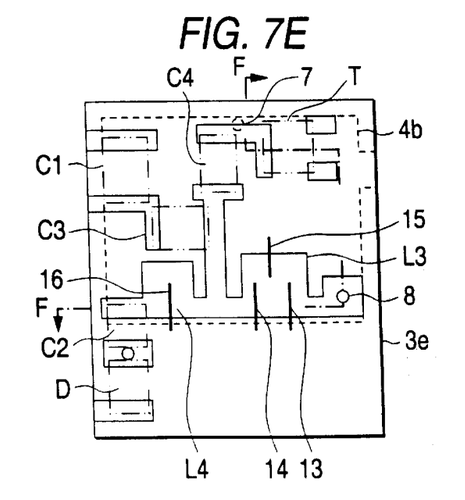

Next, by trimming of the inductor L4, that is, by trimming 16 illustrated in FIG. 7E, the inductance is increased. Due to the foregoing, the voltage control sensitivity is adjusted (raised) as illustrated by the straight line b3 in FIG. 5B. At this time, the oscillating frequency is simultaneously lowered.

Figure 5A:
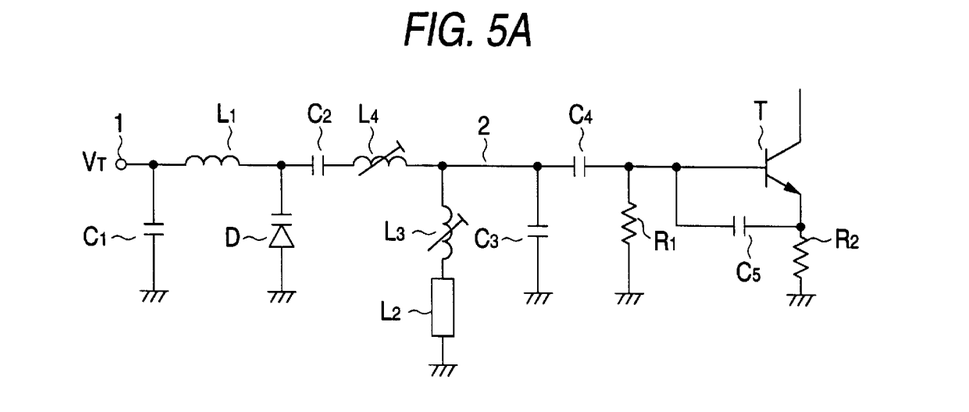
FIG. 5A is a circuit diagram showing another example of the voltage, controlled oscillator of the present invention.
Figure 5B:
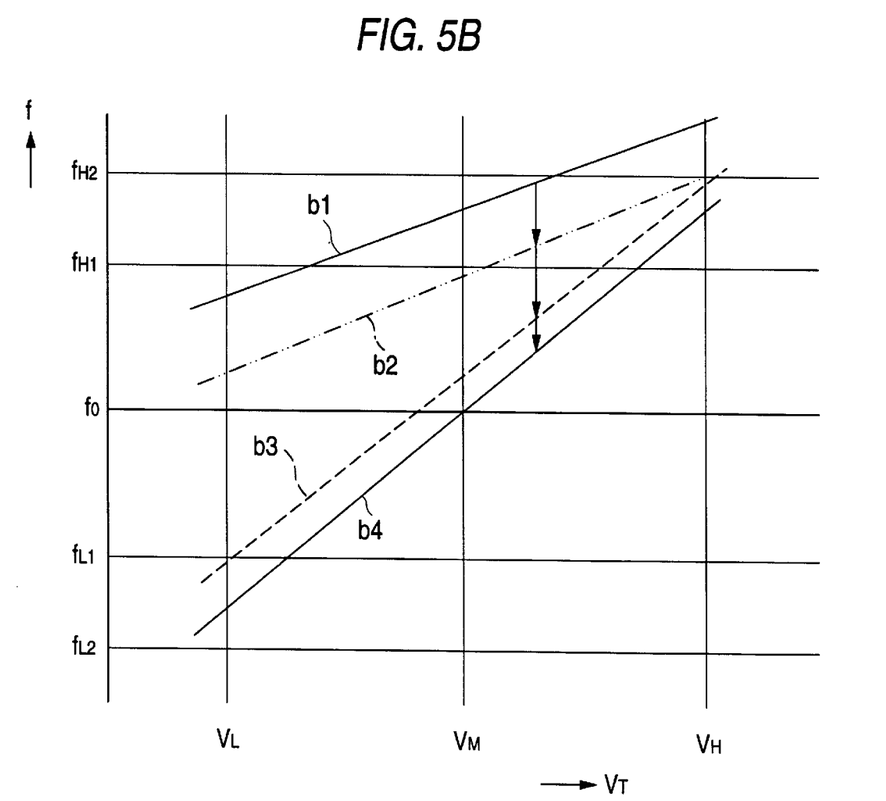
FIG. 5B is a characteristic diagram of frequency and voltage in which the adjusting process is shown.

Next, when trimming is further conducted on the inductor L3 connected in series to the main inductor L2 for a resonator, as shown by the straight line b4 in FIG. 5B, the center frequency f ($V_M$) is adjusted to the target oscillating frequency $f_0$.

When adjustment is conducted in three steps as described above, it is possible to provide the same effect as that of the first embodiment described before.

Third Embodiment

Figure 8A:
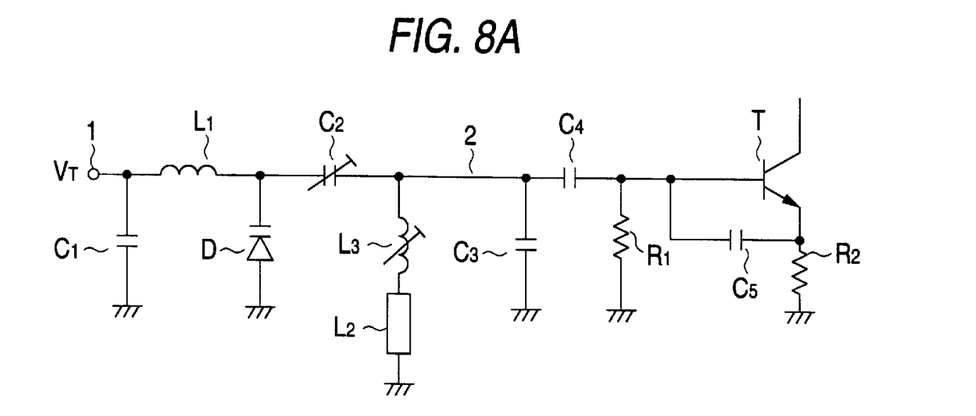
FIG. 8A is a circuit diagram showing another example of the voltage controlled oscillator of the present invention.

FIG. 8A is a view showing a third embodiment of the present invention. This embodiment is composed as follows. In the second embodiment as shown in FIGS. 4B to 7, instead of the inductor L4 for adjusting a voltage control sensitivity, it is provided the capacitor C2 for adjusting a voltage control sensitivity as shown in FIGS. 1 to 4A.

In the embodiment shown in FIG. 8A, setting is conducted as follows. In a state before conducting an adjustment, as shown by the straight line c1 in FIG. 8B, the frequency $f(V_M)$ at the center voltage is higher than the target frequency $f_0$, and the inclination of the characteristic curve of (f–V) of the voltage control sensitivity is larger than the inclination of the target characteristic curve of (f–V). First, by trimming of the inductor L3 connected in series to the inductor L2 composing a resonator, that is, by trimming as shown by the reference numerals 13 to 15 in FIG. 7E, length of the passage in which an electric current flows is increased so that the inductance can be increased. Due to the foregoing, as shown by the straight line c2 in FIG. 8B, the center oscillating frequency $f(V_M)$ is made to come close to the target frequency $f_0$.

Next, trimming is conducted on the capacitor C2 for adjusting a voltage control sensitivity, so that the capacitance is reduced. Due to the foregoing, as shown by the straight line c3 in FIG. 8B, the voltage control sensitivity is adjusted (lowered). At this time, the oscillating frequency is simultaneously increased.

Figure 8B:
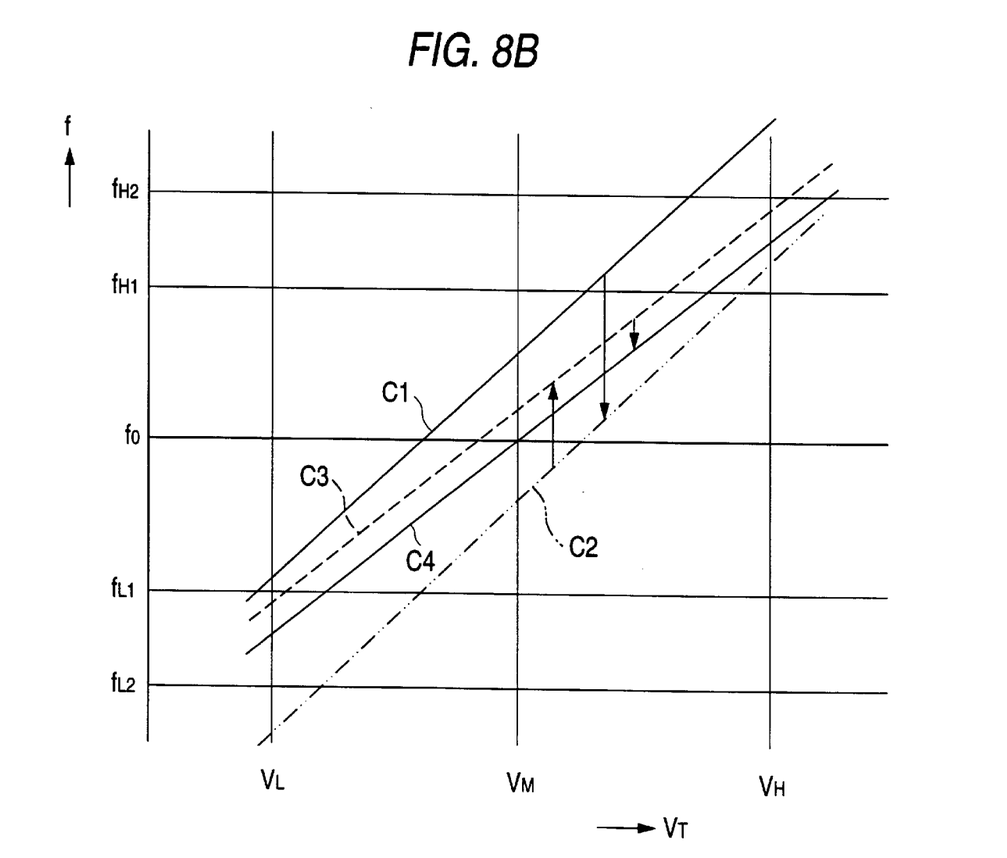
FIG. 8B is a characteristic diagram of frequency and voltage in which the adjusting process is shown.

Next, when trimming is further conducted on the inductor L3 arranged in series to the resonator L2, as shown by the straight line c4 in FIG. 8B, the center frequency $f(V_M)$ is adjusted to the target oscillating frequency $f_0$. By this example, it is possible to provide the same effect as that described before.

Fourth Embodiment

Figure 9A:
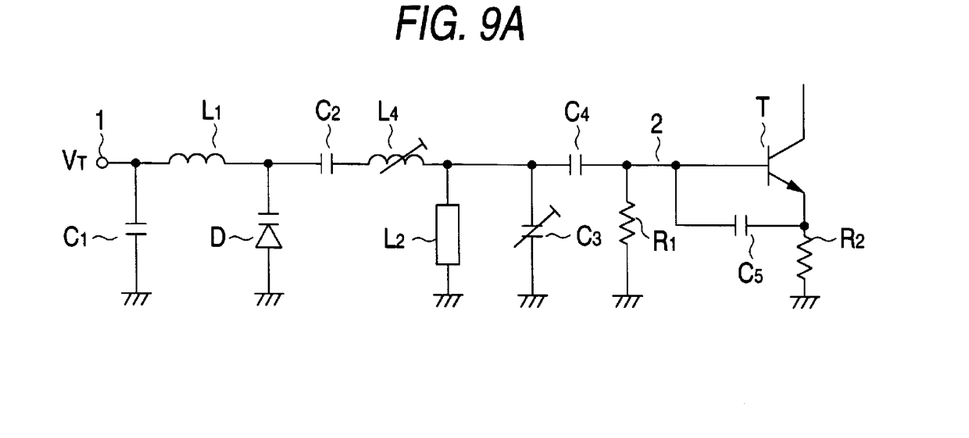
FIG. 9A is a circuit diagram showing another example of the voltage controlled oscillator of the present invention.

FIG. 9A is a view showing a fourth embodiment of the present invention. This embodiment is composed as follows.

In the example shown in FIGS. 1 to 4A, instead of the inductor C2 for adjusting a voltage control sensitivity, the inductor L4 for adjusting a voltage control sensitivity is arranged as illustrated in FIGS. 4B to 7.

In the example shown in FIG. 9A, setting is conducted as follows. In a state before conducting an adjustment, as shown by the straight line d1 in FIG. 9B, the frequency $f(V_M)$ at the center voltage is lower than the target frequency $f_0$, and the inclination of the characteristic curve of (f–V) of the voltage control sensitivity is smaller than the inclination of the target characteristic curve of (f–V). First, by trimming of the capacitor C3 for adjusting an oscillating frequency connected in parallel to the inductor L2 composing a resonator, as illustrated by the straight line d2 in FIG. 9B, the center oscillating frequency $f(V_M)$ is set a little higher than the target frequency $f_0$.

Next, by trimming of the inductor L4 for adjusting a voltage control sensitivity, the inductance is increased. Due to the foregoing, as illustrated by the straight line d3 in FIG. 9B, the voltage control sensitivity is adjusted (raised) to the target sensitivity. At this time, the oscillating frequency is simultaneously lowered.

Figure 9B:
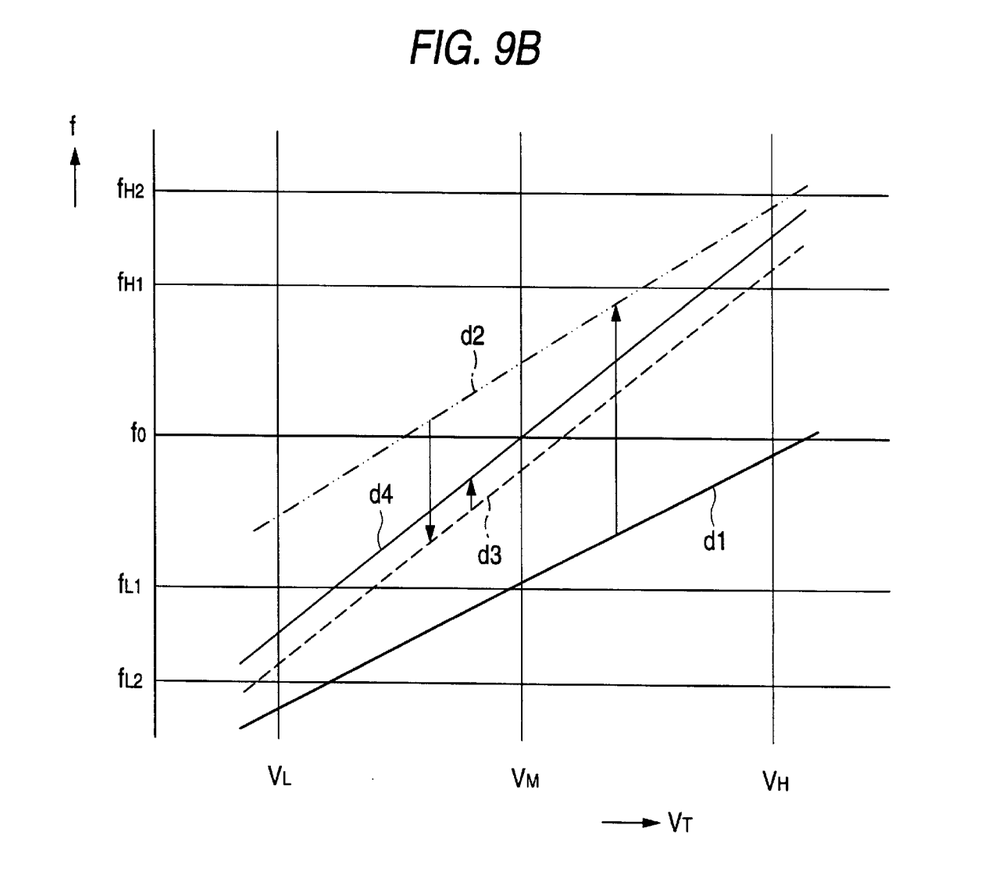
FIG. 9B is a characteristic diagram of frequency and voltage in which the adjusting process is shown.

Next, when trimming is further conducted on the capacitor C3 arranged in parallel to the resonator L2, as shown by the straight line d4 in FIG. 9B, the center frequency $f(V_M)$ is adjusted to the target oscillating frequency $f_0$. By this example, it is possible to provide the same effect as that described before.

The present invention has been explained above referring to the examples. Of course, when the present invention is executed, variations may be made by one skilled in the art, for example, the material of parts may be varied and the arrangement of electronic parts to be mounted may be varied, and further an arrangement of lamination may be adopted instead of the electronic parts. Concerning the capacitor and the inductor for adjusting an oscillating frequency and also concerning the capacitor and the inductor for adjusting a voltage control sensitivity, the present invention is not limited the provision of only one of them, but both of them may be provided.

According to the invention, not only the capacitor and the inductor for adjusting an oscillating frequency but also the capacitor or the inductor for adjusting a voltage control sensitivity is provided. Therefore, the voltage control sensitivity can be adjusted, and the yield in the manufacturing process can be enhanced.

According to the invention, the capacitor and/or the inductor for adjusting is provided on the surface of the substrate. Therefore, trimming can be easily conducted.

According to the invention, adjustment is conducted in three steps. Therefore, it is possible to conduct a highly accurate adjustment.

What is claimed is:

1. A voltage controlled oscillator comprising
a resonator for generating an oscillation signal, a frequency of which is in response to a control signal;
amplifying means for amplifying the oscillation signal;
oscillation frequency adjusting means for adjusting the frequency of the oscillation signal; and
voltage control sensitivity adjusting means for adjusting a voltage control sensitivity of the oscillation signal,
wherein said resonator comprises an input terminal to which the control signal is applied, a variable capacitance diode and a main inductor;
said oscillation frequency adjusting means comprises a first variable capacitor arranged in parallel with the main inductor of said resonator; and
said voltage control sensitivity adjusting means comprises a second variable capacitor arranged between the input terminal and said amplifying means, and also arranged between a hot terminal of said variable capacitance diode and a hot terminal of said main inductor of said resonator.

2. A voltage controlled oscillator as claimed in claim 1, wherein said oscillation frequency adjusting means and said voltage control sensitivity adjusting means are formed on a surface of a substrate of the voltage controlled oscillator.

3. A voltage controlled oscillator as claimed in claim 1, wherein the first and second variable capacitors comprise conductors formed on a surface of a substrate of the voltage controlled oscillator.

4. A voltage controlled oscillator comprising;
a resonator for generating an oscillation signal, a frequency of which is in response to a control signal;
amplifying means for amplifying the oscillation signal;
oscillation frequency adjusting means for adjusting the frequency of the oscillation signal; and
voltage control sensitivity adjusting means for adjusting a voltage control sensitivity of the oscillation signal,
wherein said resonator comprises an input terminal to which the control signal is applied, a variable capacitance diode and a main inductor;
said oscillation frequency adjusting means comprises a first variable inductor arranged between the input terminal and said amplifying means, which is serially connected to said main inductor of the resonator; and
said voltage control sensitivity adjusting means comprises a second variable inductor arranged between a hot terminal of said variable capacitance diode and a hot terminal of the first variable inductor.

5. A voltage controlled oscillator as claimed in claim 4, wherein the first and second variable inductors comprise conductors formed on a surface of a substrate of the voltage controlled oscillator.

6. A voltage controlled oscillator comprising:
a resonator for generating an oscillation signal, a frequency of which is in response to a control signal;
amplifying means for amplifying the oscillation signal;
oscillation frequency adjusting means for adjusting the frequency of the oscillation signal; and
voltage control sensitivity adjusting, means for adjusting a voltage control sensitivity of the oscillation signal,
wherein said resonator comprises an input terminal to which the control signal is applied, a variable capacitance diode and a main inductor;
said oscillation frequency adjusting means comprises a variable inductor arranged between the input terminal and said amplifying means, which is serially connected to said main inductor of the resonator; and
said voltage control sensitivity adjusting means comprises a variable capacitor arranged between a hot terminal of said variable capacitance diode and a hot terminal of said variable inductor.

7. A voltage controlled oscillator as claimed in claim 6, wherein the variable capacitor and the variable inductor comprise conductors formed on a surface of a substrate of the voltage controlled oscillator.

8. A voltage controlled oscillator comprising;
a resonator for generating an oscillation signal, a frequency of which is in response to a control signal;
amplifying, means for amplifying the oscillation signal;

oscillation frequency adjusting means for adjusting the frequency of the oscillation signal; and voltage control sensitivity adjusting means for adjusting a voltage control sensitivity of the oscillation signal, wherein said resonator comprises an input terminal to which the control signal is applied, a variable capacitance diode and a main inductor;

said oscillation frequency adjusting means comprises a variable capacitor arranged in parallel with said main inductor of said resonator; and said voltage control sensitivity adjusting means comprises a variable inductor arranged between said input terminal and said amplifying means, and also arranged between a hot terminal of said variable capacitance diode and a hot terminal of the main inductor of said resonator.

9. A voltage controlled oscillator as claimed in claim 8, wherein the variable capacitor and the variable inductor comprise conductors formed on a surface of a substrate of the voltage controlled oscillator.

10. A method of ad adjusting a voltage control oscillator having the components of an input terminal to which a control signal is applied, an amplifier, a variable capacitance diode, a main inductor, a first variable capacitor arranged in parallel with the main inductor, and a second variable capacitor arranged between the input terminal and the amplifier, and also arranged between a hot terminal of the variable capacitance diode and a hot terminal of the main inductor, comprising the steps of:

adjusting an oscillating frequency of the voltage control oscillator to be a first value by trimming a conductive material forming the first variable capacitor;

adjusting a voltage control sensitivity of the voltage control oscillator to be a predetermined value by trimming a conductive material forming the second variable capacitor; and adjusting an oscillating frequency of the voltage control oscillator to be a second value by trimming said conductive material forming the first variable capacitor.

11. A method of adjusting a voltage control oscillator having the components of an input terminal to which a control signal is applied, an amplifier, a variable capacitance diode, a main inductor, a first variable inductor arranged between the input terminal and the amplifier, which is serially connected to the main inductor, and a second variable inductor arranged between a hot terminal of the variable capacitance diode and a hot terminal of the first variable inductor, comprising the steps of;

adjusting an oscillating frequency of the voltage control oscillator to be a first value by trimming a conductive material forming the first variable inductor;

adjusting a voltage control sensitivity of the voltage control oscillator to be a predetermined value by trimming a conductive material forming the second variable inductor; and adjusting said oscillating frequency of the voltage control oscillator to be a second value by trimming said conductive material forming the first variable inductor.

12. A method of adjusting a voltage control oscillator having the components of an input terminal to which a control signal is applied, all amplifier, a variable capacitance diode, an amplifier, a main inductor, a variable inductor arranged between the input terminal and the amplifier, which is serially connected to the main inductor, and a variable capacitor arranged between a hot terminal of the variable capacitance diode and a hot terminal of the main inductor, comprising the steps of:

adjusting an oscillating frequency of the voltage control oscillator to be a first value by trimming a conductive material forming the variable inductor;

adjusting a voltage control sensitivity of the voltage control oscillator to be a predetermined value by trimming a conductive material forming the variable capacitor; and adjusting said oscillating frequency of the voltage control oscillator to be a second value by trimming a conductive material forming the variable inductor.

13. A method of adjusting a voltage control oscillator having the components of an input terminal to which a control signal is applied, an amplifier, a variable capacitance diode, a main inductor, a variable capacitor arranged in parallel with the main inductor, and a variable inductor arranged between the input terminal and the amplifier, and also arranged between a hot terminal of the variable capacitance diode and a hot terminal of the main inductor, comprising the steps of:

adjusting an oscillating frequency of the voltage control oscillator to be a first value by trimming a conductive material forming the variable capacitor;

adjusting a voltage control sensitivity of the voltage control oscillator to be a predetermined value by trimming a conductive material forming the variable inductor; and adjusting said oscillating frequency of the voltage control oscillator to be a second value by trimming said conductive material forming the variable capacitor.

* * * * *